US008751177B2

(12) United States Patent
Escobar et al.

(10) Patent No.: US 8,751,177 B2
(45) Date of Patent: Jun. 10, 2014

(54) METHOD AND ARRANGEMENT FOR ESTIMATING ANGULAR FREQUENCY

(75) Inventors: Gerardo Escobar, Baden (CH);
Antonio Coccia, Baden (CH);
Leonardo-Augusto Serpa, Zürich (CH);
Sami Pettersson, Wettingen (CH); Yales De-Novaes, Joinville (BR)

(73) Assignee: ABB Research Ltd., Zürich (CH)

( * ) Notice: Subject to any disclaimer, the term of this patent is extended or adjusted under 35 U.S.C. 154(b) by 474 days.

(21) Appl. No.: 13/075,827

(22) Filed: Mar. 30, 2011

(65) Prior Publication Data

US 2011/0241652 A1  Oct. 6, 2011

(30) Foreign Application Priority Data

Mar. 31, 2010 (EP) .................................... 10158614

(51) Int. Cl.
*G06F 19/00* (2011.01)
*G01R 23/02* (2006.01)

(52) U.S. Cl.
CPC ...................................... *G01R 23/02* (2013.01)
USPC ........................................ 702/72; 324/76.39

(58) Field of Classification Search
CPC ...... G06F 19/00; G01R 19/2513; G01R 23/02
USPC ........................................................... 702/72
See application file for complete search history.

(56) References Cited

U.S. PATENT DOCUMENTS

| 5,140,245 | A | * | 8/1992 | Stacey ............................ 318/723 |
| 5,412,353 | A | * | 5/1995 | Chaplik et al. ................. 332/127 |
| 2009/0105979 | A1 | * | 4/2009 | Escobar Valderrama et al. ................................ 702/72 |
| 2009/0154200 | A1 | * | 6/2009 | Coccia et al. ................ 363/21.02 |

OTHER PUBLICATIONS

Arruda et al., "PLL Structures for Utility Connected Systems", Proc. 36th IEEE-IAS Annual meeting., USA, (Sep. 30-Oct. 4, 2001), vol. 4, pp. 2655-2660.

(Continued)

*Primary Examiner* — Sujoy Kundu
*Assistant Examiner* — Corey Bailey
(74) *Attorney, Agent, or Firm* — Buchanan Ingersoll & Rooney PC

(57) ABSTRACT

An exemplary method and arrangement for estimating the frequency and the positive sequence of a fundamental component of a measured three-phase voltage are disclosed ($v_{\alpha\beta}$). The method includes measuring the three-phase voltage ($v_{\alpha\beta}$), calculating estimates of a fundamental frequency voltage component ($\hat{v}_{\alpha\beta,1}$) and a difference ($\hat{\phi}_{\alpha\beta,1}$) between positive and negative sequence components of the fundamental frequency voltage from an error ($\tilde{v}_{\alpha\beta}$) between the measured three-phase voltage ($v_{\alpha\beta}$) and at least one of the calculated estimates of the fundamental frequency voltage component ($\hat{v}_{\alpha\beta,1}$) and from an estimate of the angular frequency ($\hat{\omega}_0$) of the fundamental frequency voltage component, wherein the estimate of the angular frequency ($\hat{\omega}_0$) of the fundamental frequency voltage component is calculated from at lest one of the estimated differences ($\hat{\phi}_{\alpha\beta,1}$) and from the error ($\tilde{v}_{\alpha\beta}$) between the measured three-phase voltage and at least one of the calculated estimates of the fundamental frequency voltage component.

6 Claims, 7 Drawing Sheets

(56) References Cited

OTHER PUBLICATIONS

Cichowlas et al., "Active Filtering Function of Three-Phase PWM Boost Rectifier Under Different Line Voltage Conditions", IEEE Transactions on Industrial Electronics, (Apr. 2005), vol. 52, No. 2, pp. 410-419.

Karimi-Ghartemani et al., "A Method for Synchronization of Power Electronic Converters in Polluted and Variable-Frequency Environments", IEEE Transactions on Power Systems, (Aug. 2004), vol. 19, No. 3, pp. 1263-1270.

Ghosh et al., "A New Algorithm for the Generation of Reference Voltages of a DVR Using the Method of Instantaneous Symmetrical Components", IEEE Power Engineering Review, (Jan. 2002), vol. 22, Issue 1, pp. 63-65.

Hsieh et al., "Phase-Locked Loop Techniques—A Survey", IEEE Transactions on Industrial Electronics, (Dec. 1996), vol. 43, No. 6, pp. 609-615.

Kaura et al., "Operation of a Phase Locked Loop System Under Distorted Utility Conditions", IEEE Transactions on Industrial Applications, (Jan./Feb. 1997), vol. 33, No. 1, pp. 58-63.

Martinez-Montejano et al., "Fixed Reference Frame Phase-Locked Loop (FRF-PLL) for Unbalanced Line Voltage Conditions", IEEE 39th Power Electronics Specialists Conference PESC ' 08, Rhodes, Greece, (Jun. 15-19, 2008), pp. 4723-4728.

Mojiri et al., "An Adaptive Notch Filter for Frequency Estimation of a Periodic Signal", IEEE Transactions on Automatic Control, (Feb. 2004), vol. 49, No. 2, pp. 314-318.

Rodriguez et al., "Advanced Grid Synchronization System for Power Converters under Unbalanced and Distorted Operating Conditions", IEEE Industrial Electronics, IECON 2006—32nd Annual Conference, (Nov. 6-10, 2006), pp. 5173-5178.

Rodriguez et al., "Grid Synchronization of Power Converters using Multiple Second Order Generalized Integrators", IEEE Industrial Electronics, IECON 2008—34th Annual Conference, (Nov. 10-13, 2008), pp. 755-760.

Rodriguez et al., "Decoupled Double Synchronous Reference Frame PLL for Power Converters Control", IEEE Transactions on Power Electronics, (Mar. 2007), vol. 22, No. 2, pp. 584-592.

Silva et al., "Performance Evaluation of PLL Algorithms for Single-phase Grid-connected Systems", IEEE Industry Applications, 39th IAS Annual Meeting 2004, (Oct. 3-7, 2004), vol. 4, pp. 2259-2263.

Song et al., "Instantaneous Phase-Angle Estimation Algorithm under Unbalanced Voltage-Sag Conditions", Generation, Transmission and Distribution, IEEE Proceedings, (Nov. 2000), vol. 147, Issue. 6, pp. 409-415.

Song et al., "An Instantaneous Phase Angle Detection Algorithm under Unbalanced Line Voltage Condition", 30th IEEE Power Electronics Specialists Conference. PESC 99, (Jun. 27-Jul. 1, 1999), vol. 1, pp. 533-537.

Svensson, "Synchronisation Methods for Grid-Connected Voltage Source Converters", IEEE Proceeding. Generation, Transmission and Distribution, (May 2001), vol. 148, Issue. 3, pp. 229-235.

Teodorescu et al., "Flexible Control of Small Wind Turbines with Grid Failure Detection Operation in Stand-Alone and Grid-Connected Mode", IEEE Transactions on Power Electronics, (Sep. 2004), vol. 19, No. 5, pp. 1323-1332.

Yazdani et al., "A Fast and Accurate Synchronization Technique for Extraction of Symmetrical Components", IEEE Transactions on Power Electronics, (Mar. 2009), vol. 24, No. 3, pp. 674-684.

\* cited by examiner

METHOD AND ARRANGEMENT FOR ESTIMATING ANGULAR FREQUENCY

RELATED APPLICATION

This application claims priority under 35 U.S.C. §119 to European Patent Application No. 10158614.7 filed in Europe on Mar. 31, 2010, the entire content of which is hereby incorporated by reference in its entirety.

FIELD

The present disclosure relates to angular frequency, such as a method and arrangement for estimating angular frequency and reconstructing a positive-sequence component of a three-phase reference signal.

BACKGROUND INFORMATION

Some applications require estimation of the fundamental angular frequency and extraction of a clean balanced three-phase sinusoidal signal, i.e. the fundamental positive sequence component, from a reference signal, which may be subject to severe unbalance and high harmonic distortion. For example, this is the case in connection with the synchronization of three-phase grid-connected systems, such as power conditioning equipment, flexible ac transmission systems (FACTS) [2]-[3], power line conditioners, regenerative drives, uninterruptible power supplies (UPS) [4]-[5], grid-connected inverters for alternative energy sources, and other distributed generation and storage systems.

The most extended technique used for frequency-insensitive positive-sequence detection is the conventional three-phase phase-locked loop (PLL) based on the synchronous reference frame (SRF-PLL) [6], see also [1] for a complete review of conventional schemes. Different schemes have been disclosed based on this conventional scheme [7]-[11]. Like many other schemes, the SRF-PLL relays in a linearization assumption, and thus, the results can only be guaranteed locally. Under ideal utility conditions, i.e. without harmonic distortion or unbalance, a relatively high bandwidth feedback loop of the SRF-PLL yields a fast and precise detection of the phase angle and amplitude of the reference signal. However, most of the schemes based on the SRF-PLL approach are very sensitive to harmonic distortion [12]-[13].

If the reference signal is distorted with low-order harmonics, i.e. harmonics close to the fundamental frequency, the bandwidth of the SRF-PLL feedback loop can be reduced to reject and cancel out the effect of these harmonics on the output. However, the PLL bandwidth reduction is not an acceptable solution as its speed of response is reduced considerably as well. It should be understood that the problem of estimating this fundamental component gets even more challenging in the case of unbalanced signals [11], [14].

SUMMARY

An exemplary embodiment is directed to a method for estimating a frequency and the positive sequence of a fundamental component of a measured three-phase voltage are disclosed ($v_{\alpha\beta}$). The method includes measuring the three-phase voltage ($v_{\alpha\beta}$), calculating estimates of a fundamental frequency voltage component ($\hat{v}_{\alpha\beta,1}$) and a difference ($\hat{\phi}_{\alpha\beta,1}$) between positive and negative sequence components of the fundamental frequency voltage from an error ($\tilde{v}_{\alpha\beta}$) between the measured three-phase voltage ($v_{\alpha\beta}$) and at least one of the calculated estimates of the fundamental frequency voltage component ($\hat{v}_{\alpha\beta,1}$) and from an estimate of the angular frequency ($\hat{\omega}_0$) of the fundamental frequency voltage component, wherein the estimate of the angular frequency ($\hat{\omega}_0$) of the fundamental frequency voltage component is calculated from at lest one of the estimated differences ($\hat{\phi}_{\alpha\beta,1}$) and from the error ($\tilde{v}_{\alpha\beta}$) between the measured three-phase voltage and at least one of the calculated estimates of the fundamental frequency voltage component.

Another exemplary embodiment is directed to an arrangement for estimating the frequency of a measured three-phase voltage ($v_{\alpha\beta}$). The arrangement comprises means for measuring the three-phase voltage ($v_{\alpha\beta}$), and means for calculating estimates of a fundamental frequency voltage component ($\hat{v}_{\alpha\beta,1}$) and a difference ($\hat{\phi}_{\alpha\beta,1}$) between positive and negative sequence components of a fundamental frequency voltage from an error ($\tilde{v}_{\alpha\beta}$) between the measured three-phase voltage ($v_{\alpha\beta}$) and at least one of the calculated estimates of the fundamental frequency voltage component ($\hat{v}_{\alpha\beta,1}$) and from an estimate of an angular frequency ($\hat{\omega}_0$) of the fundamental voltage component. The estimate of the angular frequency ($\hat{\omega}_0$) of the fundamental frequency voltage component is calculated from at least one of the estimated differences ($\hat{\phi}_{\alpha\beta,1}$) and from the error ($\tilde{v}_{\alpha\beta}$) between the measured three-phase voltage and at least one of the calculated estimates of the fundamental frequency voltage component.

BRIEF DESCRIPTION OF THE DRAWINGS

In the following the disclosure will be described in greater detail by means of exemplary embodiments with reference to the accompanying drawings, in which.

DETAILED DESCRIPTION

Figure 1:
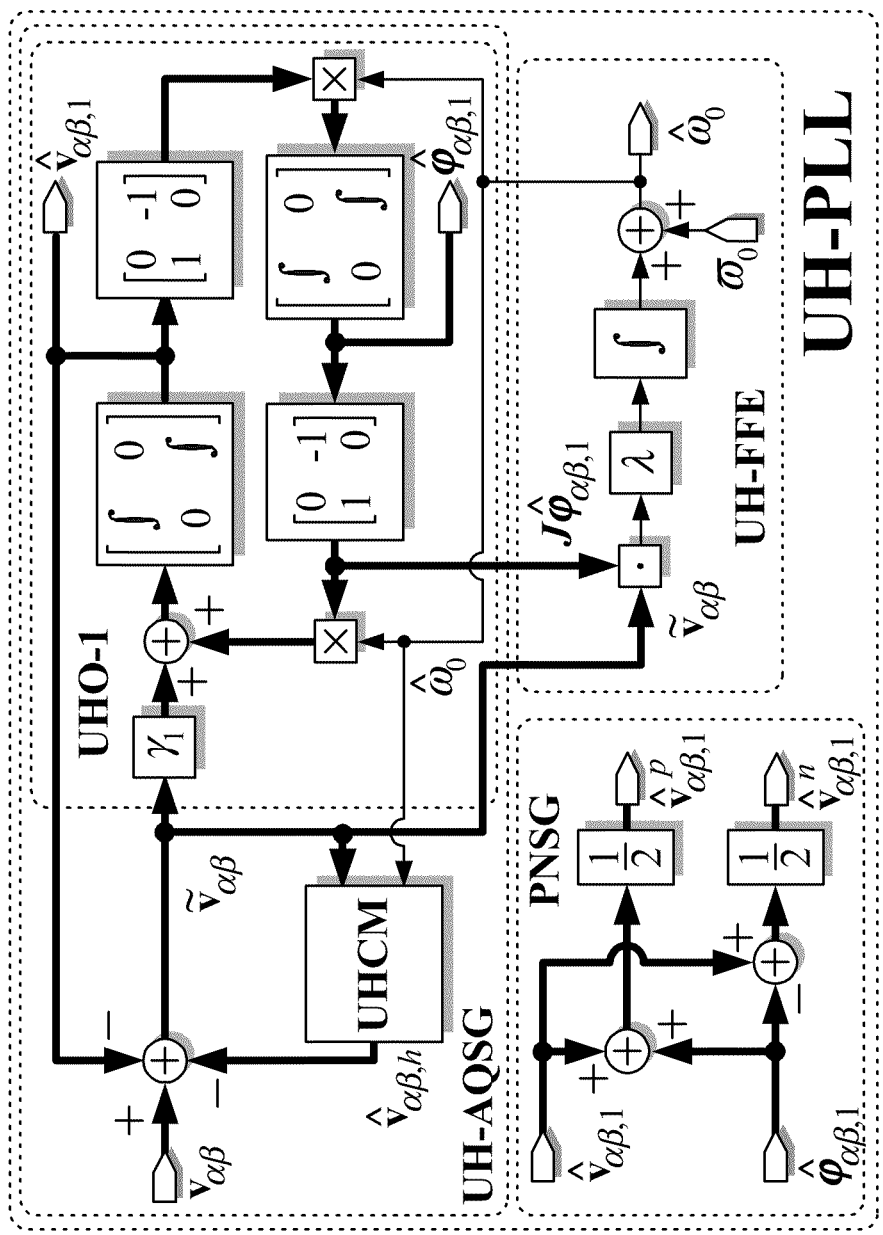
FIG. 1 illustrates a block diagram of estimator in accordance with an exemplary embodiment.

An object of the present disclosure is to provide a method and arrangement to overcome the above problems.

The disclosure is based on the idea of using an estimator for estimating the positive-sequence component of a three-phase signal and, an adaptive law to reconstruct the fundamental frequency so that a clean signal corresponding to the three-phase signal can be formed.

An advantage of the disclosed exemplary method is that it produces an estimate of the angular frequency of the fundamental component accurately even if the signal is unbalanced and distorted.

An advantage of a exemplary embodiment of the present disclosure is that it produces a frequency estimate accurately even if the signal is highly distorted.

In contrast to the schemes in [15] and [16], an exemplary embodiment of the present disclosure also includes a harmonic compensation mechanism to deal with the harmonic distortion present in the reference signal.

Further, the present PLL does not require transformation of variables into synchronous reference frame coordinates as in most PLL schemes. Rather, as in [15], the present PLL scheme requires the transformation of the measured reference signal to its representation in fixed-frame coordinates only.

The design of the exemplary PLL of the present disclosure is based on a more complete and generic model description of an unbalanced reference signal distorted by low order harmonics, which might also be unbalanced.

The synchronization process in the exemplary PLL of the present disclosure is based on the detection of the fundamental frequency. The idea of using the frequency detection for the grid synchronization application has also been reported in [16], [17] and [18], and lately in [15]. In other conventional PLL schemes the synchronization is based on the detection of the phase angle.

Therefore, the PLL of the present disclosure is intended to perform properly under unbalanced conditions, sags, swells and angular frequency variations, among others, providing a fast and precise response. Moreover, since the scheme is provided with an explicit harmonic compensation mechanism (UHCM) according to an embodiment, it is able to alleviate the effects of the low-harmonics distortion on the estimation of the fundamental frequency and on the positive sequence of the fundamental component of the reference signal.

In an embodiment of the present disclosure an estimate of the fundamental frequency of a measured reference signal is produced. The measured reference signal is typically a three-phase voltage, the frequency of which needs to be detected. In another embodiment, also the positive and negative sequences of the measured reference signal are estimated. The scheme of the disclosure is referred to as UH-PLL because it involves the operation under unbalanced and harmonic distortion. The UH-PLL is composed of an estimator for the fundamental component of the measured reference signal (UH-AQSG), an estimator for the fundamental frequency (UH-FFE) and, in an exemplary embodiment, a generator of positive and negative sequences (PNSG). To deal with the harmonic distortion present in the reference signal, an exemplary embodiment also includes a harmonic compensation mechanism (UHCM). A schematic of an exemplary UH-PLL that includes all the above elements is presented in FIG. 1.

FIG. 1 illustrates a block diagram of an estimator in accordance with an exemplary embodiment. In this diagram all thick lines represent vector variables, while normal lines represent scalar variables. The design of estimators UH-AQSG, UH-FFE and UHCM is based on a quite general model for a three-phase signal, which is described next for better understanding of the exemplary embodiments.

Considering that the three-phase measured signal $v_{\alpha\beta}$ is already described in fixed-frame ($\alpha\beta$) coordinates. To include the effects of the harmonic distortion, this signal can be composed of the sum of the fundamental component plus higher harmonic components. In an unbalanced case, Equation 1 uses positive and negative sequence symmetric components for every single harmonic component.

$$v_{\alpha\beta} = \sum_{k \in H} v_{\alpha\beta,k} = \sum_{k \in H}(v^p_{\alpha\beta,k}+v^n_{\alpha\beta,k}) = \sum_{k \in H}(e^{Jk\theta_0}V^p_{\alpha\beta,k}+e^{-Jk\theta_0}V^n_{\alpha\beta,k}) \quad (1)$$

where $v_{\alpha\beta}$ is the measured reference signal; k is the index of the harmonic component, $H=\{1, 3, 5, \ldots\}$ is the set of harmonics under concern; $v_{\alpha\beta,k}$ is the k-th harmonic component; $v^p_{\alpha\beta,k}$ and $v^n_{\alpha\beta,k}$ are the positive and negative sequences of $v_{\alpha\beta,k}$, in particular, $v^p_{\alpha\beta,1}$ and $v^n_{\alpha\beta,1}$ are the positive and negative sequences of the fundamental component $v_{\alpha\beta,1}$; $\theta_0$ is the phase angle; and the rotating matrices $e^{Jk\theta_0}$ and J are defined as $$e^{Jk\theta_0} = \begin{bmatrix} \cos k\theta_0 & \sin k\theta_0 \\ -\sin k\theta_0 & \cos k\theta_0 \end{bmatrix}, \quad (2)$$

$$e^{-Jk\theta_0} = (e^{Jk\theta_0})^T,$$

$$J = \begin{bmatrix} 0 & -1 \\ 1 & 0 \end{bmatrix},$$

$$J^T = -J$$

From the above, the following model can be established $$\dot{v}_{\alpha\beta,k} = k\omega_0 J\phi_{\alpha\beta,k}, \quad \forall k \in H$$

$$\dot{\phi}_{\alpha\beta,k} = k\omega_0 J v_{\alpha\beta,k} \quad (3)$$

where $\dot{\theta}_0 = \omega_0$, and an auxiliary variable has been introduced $$\phi_{\alpha\beta,k} = v^p_{\alpha\beta,k} - v^n_{\alpha\beta,k} \quad (4)$$

which is needed to complete the model description. Notice that $\phi_{\alpha\beta,k}$ represents the difference between both sequences (for the k-th harmonic), while $v_{\alpha\beta,k}=v^p_{\alpha\beta,k}+v^n_{\alpha\beta,k}$ represents the sum.

The reference signal can now be reconstructed as $$v_{\alpha\beta} = \sum_{k \in H} v_{\alpha\beta,k} \quad (5)$$

Moreover, it is possible to establish the following relationship between the fundamental component and the positive and negative sequences.

$$\begin{bmatrix} v_{\alpha\beta,1} \\ \varphi_{\alpha\beta,1} \end{bmatrix} = \begin{bmatrix} I_2 & I_2 \\ I_2 & -I_2 \end{bmatrix}\begin{bmatrix} v^p_{\alpha\beta,1} \\ v^n_{\alpha\beta,1} \end{bmatrix} \quad (6)$$

where $I_2$ is the 2×2 identity matrix.

UH-AGSG

Based on model (3), (5) an estimator (7) is formed for the k-th ($k \in H$) harmonic component of the reference signal, which consists of a copy of the system model (3) to which a damping term is added, that is, $$\dot{\hat{v}}_{\alpha\beta,k} = k\hat{\omega}_0 J\hat{\phi}_{\alpha\beta,k} + \gamma_k \tilde{v}_{\alpha\beta}, \quad k \in H \quad (7)$$

$$\dot{\hat{\phi}}_{\alpha\beta,k} = k\hat{\omega}_0 J\hat{v}_{\alpha\beta,k}$$

$$\hat{v}_{\alpha\beta} = \sum_{k \in H} \hat{v}_{\alpha\beta,k}$$

where $\gamma_k$ ($k \in H$) is a positive design parameter used to introduce the required damping; $\hat{\omega}_0$ is the estimate of the fundamental frequency $\omega_0$; $\hat{v}_{\alpha\beta,k}$ and $\hat{\phi}_{\alpha\beta,k}$ are the estimates of $v_{\alpha\beta,k}$ and $\phi_{\alpha\beta,k}$, respectively; and an error $\tilde{v}_{\alpha\beta}=v_{\alpha\beta}-\hat{v}_{\alpha\beta}$ is defined, with $\hat{v}_{\alpha\beta}$ the overall estimated signal. In fact, the estimated signal $\hat{v}_{\alpha\beta}$ can be decomposed as the sum of the fundamental component plus the harmonic distortion as follows:

$$\hat{v}_{\alpha\beta} = \hat{v}_{\alpha\beta,1} + \hat{v}_{\alpha\beta,h} \quad (8)$$

where $\hat{v}_{\alpha\beta,1}$ represents the estimate of the fundamental component $v_{\alpha\beta,1}$, and $\hat{v}_{\alpha\beta,h}$ represents the estimate of the harmonic distortion of the measured signal, i.e. the addition of all higher harmonics.

Notice that particularly the fundamental component $\hat{v}_{\alpha\beta,1}$ can be reconstructed on the basis of (7) according to $$\dot{\hat{v}}_{\alpha\beta,1} = \hat{\omega}_0 J \hat{\phi}_{\alpha\beta,1} + \gamma_1 \tilde{v}_{\alpha\beta}$$

$$\dot{\hat{\phi}}_{\alpha\beta,1} = \hat{\omega}_0 J \hat{v}_{\alpha\beta,1} \qquad (9)$$

In fact, this estimator reconstructs the fundamental component of state variables $v_{\alpha\beta}$ and $\phi_{\alpha\beta}$, that is, it generates two pairs of quadrature signals. Therefore, this estimator is referred to as the adaptive quadrature signals generator under unbalanced conditions and harmonic distortion (UH-AQSG).

It should be noted from FIG. 1 that the UH-AQSG is composed of a basic block referred to as the unbalanced harmonic oscillator (UHO-1) tuned at the fundamental frequency, whose output is compared to the measured reference signal and the error is fed back to the same UHO-1.

PNSG

Having the estimates $\hat{v}_{\alpha\beta,1}$ and $\hat{\phi}_{\alpha\beta,1}$ coming out of UH-AQSG (9) and on the basis of relationship (6), the positive and negative sequences of the fundamental component of the reference signal can now be reconstructed as follows $$\hat{v}^p_{\alpha\beta,1} = \frac{1}{2}(\hat{v}_{\alpha\beta,1} + \hat{\phi}_{\alpha\beta,1}) \qquad (10)$$

$$\hat{v}^n_{\alpha\beta,1} = \frac{1}{2}(\hat{v}_{\alpha\beta,1} - \hat{\phi}_{\alpha\beta,1})$$

which is referred to as the generator of positive and negative sequences of the fundamental component (PNSG). In fact, the positive sequence of the fundamental component is the most used signal for many applications.

According to an exemplary embodiment, the positive sequence of the fundamental voltage component is calculated from the estimated fundamental component $\hat{v}_{\alpha\beta,1}$ of the voltage and from the difference ($\hat{\phi}_{\alpha\beta,1}$) between positive and negative sequences. The positive sequence of the fundamental component is a pure sinusoidal balanced signal, which is in phase with the measured reference signal, and thus it can be taken as a basis for transformation, or to design a cleaner reference, or as a synchronization signal.

UHCM

Figure 2:
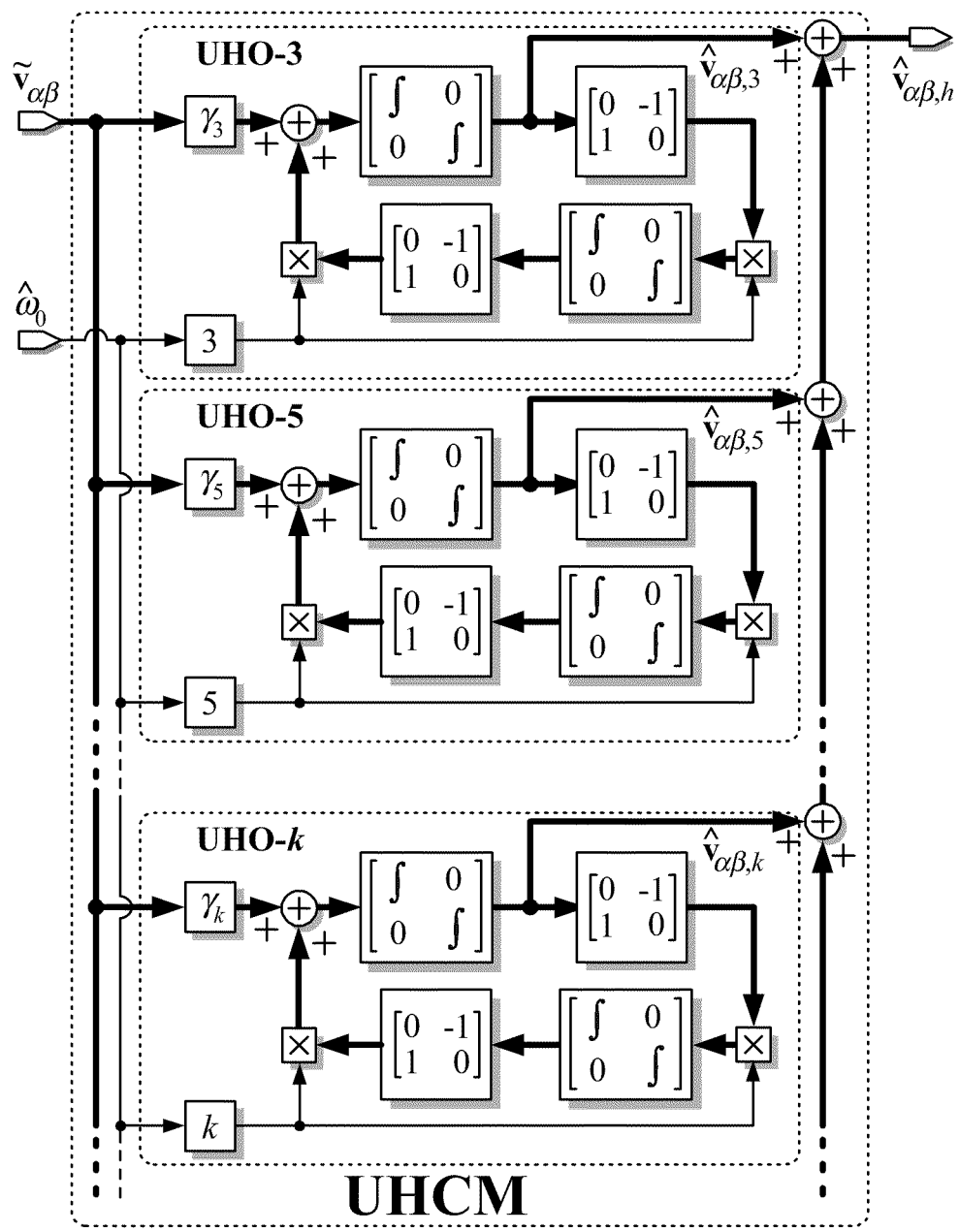
FIG. 2 illustrates a block diagram of a harmonic compensation mechanism in accordance with an exemplary embodiment.

The idea behind the harmonic compensation mechanism (UHCM) is to design an estimator for reconstructing the harmonic distortion part of the reference signal $\hat{v}_{\alpha\beta,h}$, which is later subtracted from the original signal, as shown in the scheme of FIG. 2.

FIG. 2 illustrates a block diagram of a harmonic compensation mechanism in accordance with an exemplary embodiment. Like in the UH-AQSG, the design of this estimator is also based on the description (7). The UHCM can thus be seen as a plug-in block that can be easily added to a more basic scheme.

The harmonic distortion component $\hat{v}_{\alpha\beta,h}$ computed in block UHCM is performed as follows. First, each harmonic component $\hat{v}_{\alpha\beta,k}$ is reconstructed according to (7) for $k \in \{3, 5, \ldots\}$. Second, all harmonic components are accumulated in a single signal $\hat{v}_{\alpha\beta,h}$ as follows $$\dot{\hat{v}}_{\alpha\beta,k} = k\hat{\omega}_0 J \hat{\phi}_{\alpha\beta,k} + \gamma_k \tilde{v}_{\alpha\beta}, \quad k \in \{3, 5, \ldots\} \qquad (11)$$

$$\dot{\hat{\phi}}_{\alpha\beta,k} = k\hat{\omega}_0 J \hat{v}_{\alpha\beta,k}$$

$$\hat{v}_{\alpha\beta,h} = \sum_{k \in \{3,5,\ldots\}} \hat{v}_{\alpha\beta,k}$$

A block diagram of the UHCM is presented in FIG. 2. The UHCM consists of a bank of basic blocks referred to as unbalanced harmonic oscillators (UHO), each of which can be tuned at the harmonics under concern. The difference between the UHOs of FIG. 2 and UHO-1 of FIG. 1 is that the used design parameters $\gamma_k$ are different and that the estimate of the fundamental frequency is multiplied by a constant representing the harmonic number. In FIG. 2, the estimated harmonics are the 3rd, 5th and k-th harmonic components.

The UHCM described above is preferably used depending on the harmonic distortion present in the reference signal. If the UHCM is not used, the basic scheme U-PLL still has certain robustness against the harmonic distortion present in the measured reference signal due to its selective nature.

UH-FFE

According to an exemplary embodiment of the present disclosure, the estimate of the angular frequency $\hat{\omega}_0$ of the fundamental voltage component is calculated from the estimated difference $\hat{\phi}_{\alpha\beta,1}$ and from the error $\tilde{v}_{\alpha\beta}$ between the measured three-phase voltage and the calculated estimate of the fundamental component. The reconstruction of the signal $\omega_0$ involved in the UH-AQSG (9) and in the UHCM (11) is preferably performed by the adaptive characteristics of Equation 12:

$$\dot{\hat{\omega}}_0 = \lambda \tilde{v}_{\alpha\beta}^T J \hat{\phi}_{\alpha\beta,1} \qquad (12)$$

where $\lambda > 0$ is a design parameter representing the adaptation gain, and J is the skew symmetric matrix defined previously in (2). This estimator is referred to as the fundamental frequency estimator under unbalance and distorted conditions (UH-FFE).

In the diagram of FIG. 1, a feedforward term $\bar{\omega}_0$ has been included in the UH-FFE to prevent high transients during the startup operation. The used feedforward term is preferably the nominal value of the frequency of the measured signal, if such a nominal value is known.

In the following some rules for a first tuning of control parameters $\lambda$ and $\gamma_k$ ($k \in H$) are presented. For this purpose, some simplifications are considered. First, a non-distorted case is considered, i.e. no UHCM block is included. Second, it is considered that the system is in balanced operation, that is, $\phi_{\alpha\beta} = v_{\alpha\beta}$. Third, a linearization process is considered. These simplifications yield an LTI system which coincides with the one studied in [15], where they propose the tuning of the parameters according to the following expressions:

$$\gamma_1 \cong \sqrt{2}\,\omega_{BW} \qquad (13)$$

$$\lambda \cong \left(\frac{\omega_{BW}}{|v_{\alpha\beta}|}\right)^2$$

where $\omega_{BW}$ is the desired bandwidth of the fundamental frequency estimator, which is recommended to be selected in the range of $$\frac{\omega_0}{5} \leq \omega_{BW} \leq \frac{\omega_0}{2}.$$

For the rest of the gains $\gamma_k$ ($k \in \{3, 5, \ldots\}$), a first tuning rule can be stated as follows. In the low frequency range, the response of the remaining dynamics observed by the UHCM can be a stable second-order system. On the other hand, it can be assumed that the UHOs are very selective, and thus, they only affect the corresponding harmonic component. Therefore, disregarding, for simplicity, the influence of the second-order system frequency response, each gain $\gamma_k$ ($k \in \{3, 5, \ldots\}$) can be fixed at:

$$\gamma_k = \frac{2.2}{T_{s,k}}, \quad (14)$$

$$(k \in \{3, 5, \ldots\})$$

where $T_{s,k}$ is the desired response time for the envelope of each harmonic component (evaluated between 10% to 90% of a step response of the amplitude of the corresponding sinusoidal perturbation).

For the numerical results, the following parameters have been selected $\gamma_1=350$ and $\lambda=1.5$, which correspond approximately to a bandwidth of $\omega_{BW}=150$ rad/s (24 Hz). It is assumed that the reference signal also contains 3rd and 5th harmonics, and thus the UHCM contains UHOs tuned at these harmonics. The gains in the UHCM are fixed to $\gamma_3=300$ and $\gamma_5=200$, which correspond to response times for each UHO of $T_{s,3}=7.3$ ms and $T_{s,5}=11$ ms, respectively. The reference signal has a nominal frequency of $\bar{\omega}_0=314.16$ rad/s (50 Hz) and an approximate amplitude of $|v_{\alpha\beta}|=100$ V. The following test cases have been considered for the reference signal:

(i) Balanced condition. The reference signal is only formed by a positive sequence of an amplitude of 100 V, and a fundamental frequency of 314.16 rad/s (50 Hz) with a zero phase shift.

(ii) Unbalanced condition. The reference signal includes both a positive and a negative sequence component. The positive sequence has an amplitude of 100 V at 314.16 rad/s (50 Hz) and with a zero phase shift. For the negative sequence, an amplitude of 30 V and a zero phase shift are considered.

(iii) Harmonic distortion. 3rd and 5th harmonics are added to the previous unbalanced signal to create a periodic distortion. Both harmonics also have a negative sequence component to allow unbalance in harmonics as well. Both positive and negative sequences of these harmonics have an amplitude of 10 V and a zero phase shift.

(iv) Frequency variations. A step change is introduced in the fundamental frequency of the reference signal, going from 314.16 rad/s (50 Hz) to 219.9 rad/s (35 Hz).

Figure 3:
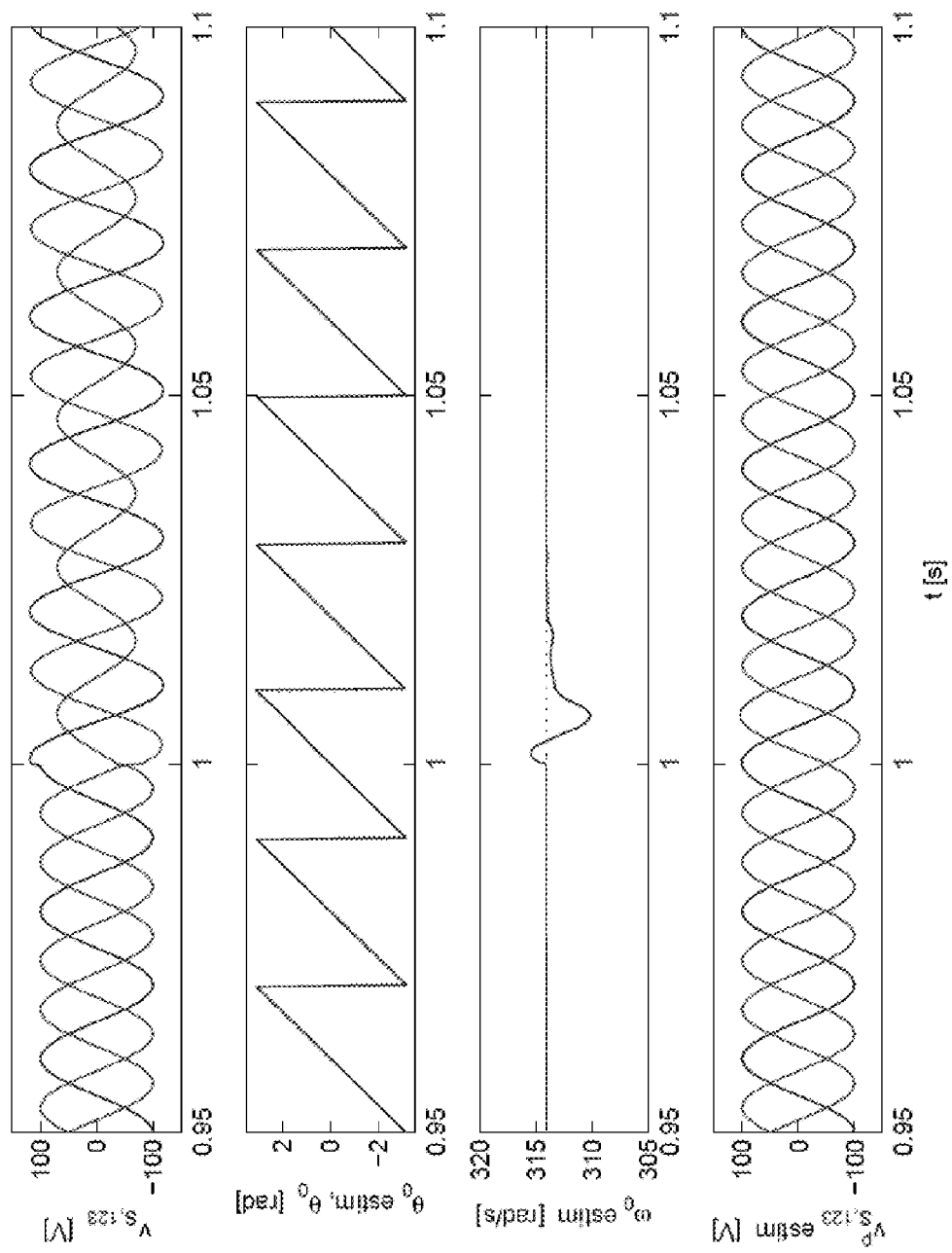
FIGS. 3, 4 and 6 illustrates transient responses in accordance with an exemplary embodiment.

FIG. 3 illustrates a transient response in accordance with an exemplary embodiment. In particular, FIG. 3 shows the transient response obtained with the UH-PLL of the present embodiment when the reference signal goes from a balanced to an unbalanced operation condition at time t=1 s. After a relatively short transient, all signals return to their desired values. For instance, it is observed that the estimated phase angle (solid line) follows the actual phase angle (dashed line) after an almost imperceptible transient. The estimated frequency (solid line) is also maintained at its reference fixed to 316.14 rad/s (dotted line) after a small transient. Moreover, the estimated positive sequence of the fundamental component has an almost imperceptible variation. FIG. 3 and also FIGS. 4, 5, 6 and 7 show (from top to bottom) the reference signal in three-phase coordinates $v_{123}$, estimated phase angle $\hat{\theta}_0$, estimated angular frequency $\hat{\omega}_0$, and estimated positive sequence of the fundamental component in three-phase coordinates $v_{123,1}^P$.

Figure 4:
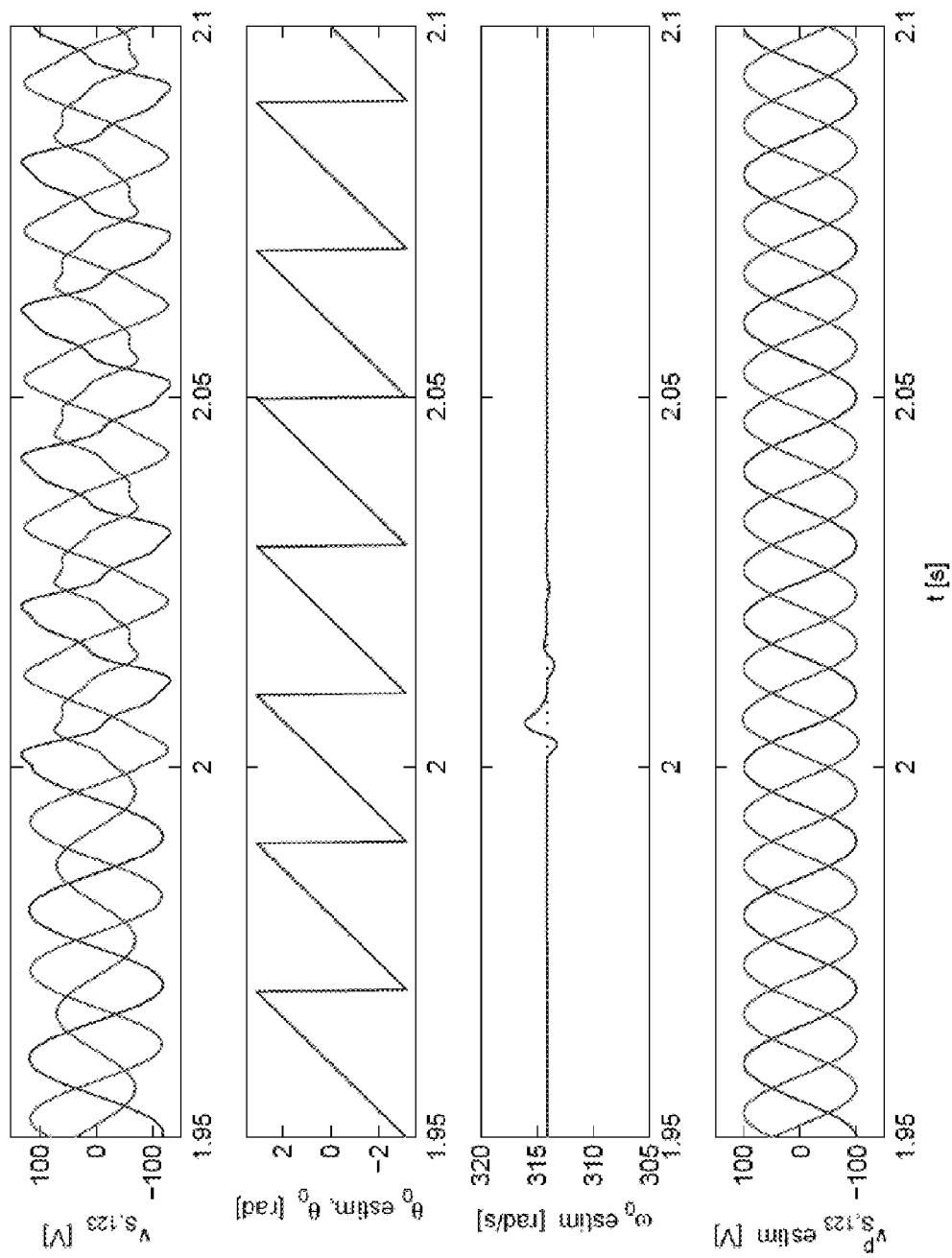

FIG. 4 illustrates another transient response in accordance with an exemplary embodiment. In particular, FIG. 3 shows the transient response of the UH-PLL when harmonic distortion is added to the already unbalanced reference signal at t=2 s. After a relatively short transient all signals return to their desired values. The estimated frequency (solid line) is also maintained at its reference fixed to 316.14 rad/s (dotted line) after a small transient without further fluctuations. Moreover, the estimated positive sequence of the fundamental component, as well as the estimated phase angle, have an almost imperceptible transient.

For comparison purposes, the FRF-PLL scheme of [15] has also been implemented. In this example, it has been tuned based on the exemplary bandwidth criteria, where, $\omega_{BW}=83$ r/s (13 Hz), which is lower than the bandwidth of the UH-PLL to avoid excess of ripple, and still allow an acceptable dynamical response.

Figure 5:
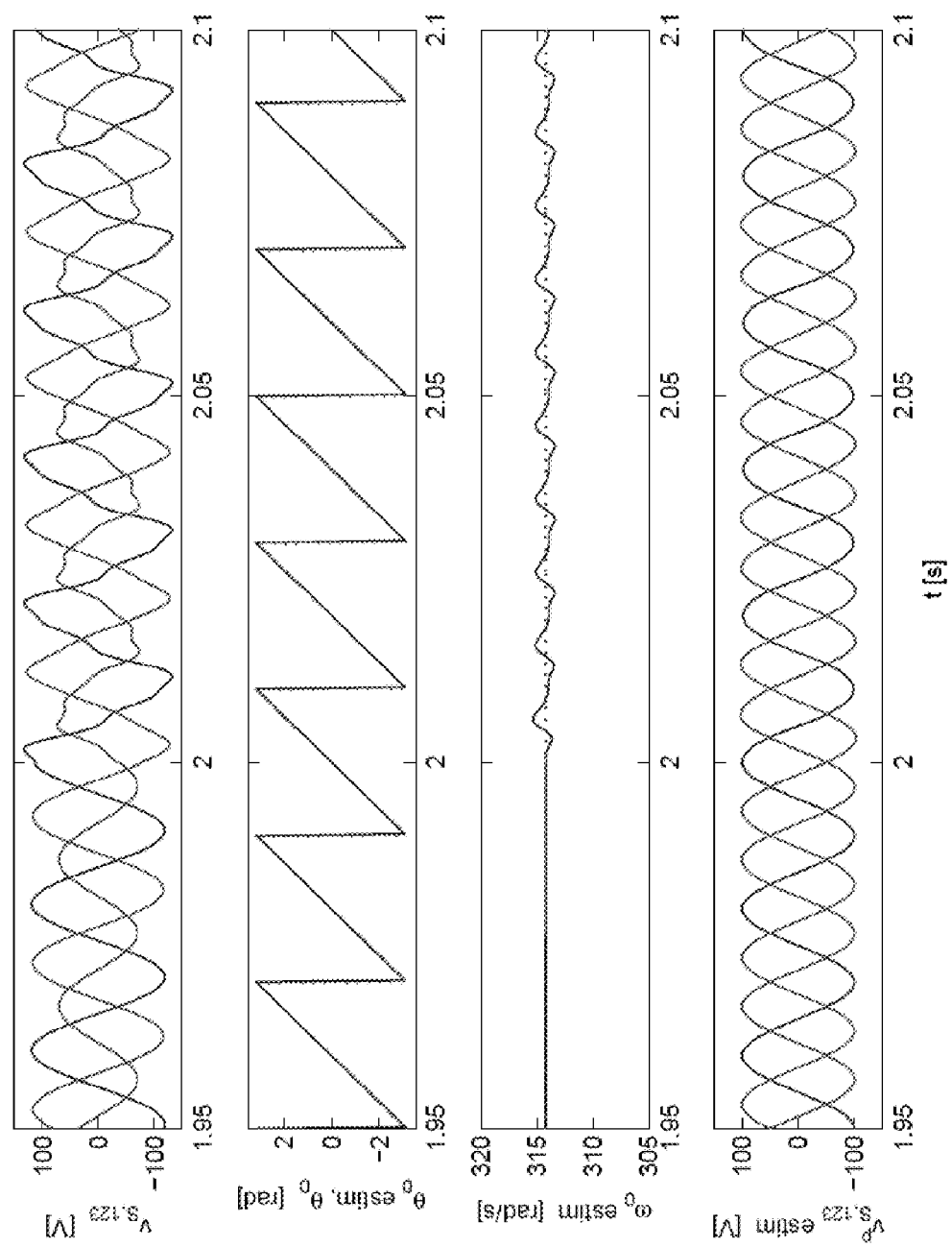
FIGS. 5 and 7 illustrates transient responses of a conventional method in accordance with the prior art.

FIG. 5 illustrates a conventional transient response in accordance with the prior art. In particular, FIG. 5 shows the transient response obtained with the conventional FRF-PLL method when harmonic distortion is added to the already unbalanced reference signal at t=2 s. A persistent fluctuation appears in the estimated fundamental frequency, which is propagated to the estimated phase angle and causes a slight deformation in the positive sequence signals. This is due to the impossibility of the FRF-PLL scheme to handle the harmonic distortion.

Figure 6:
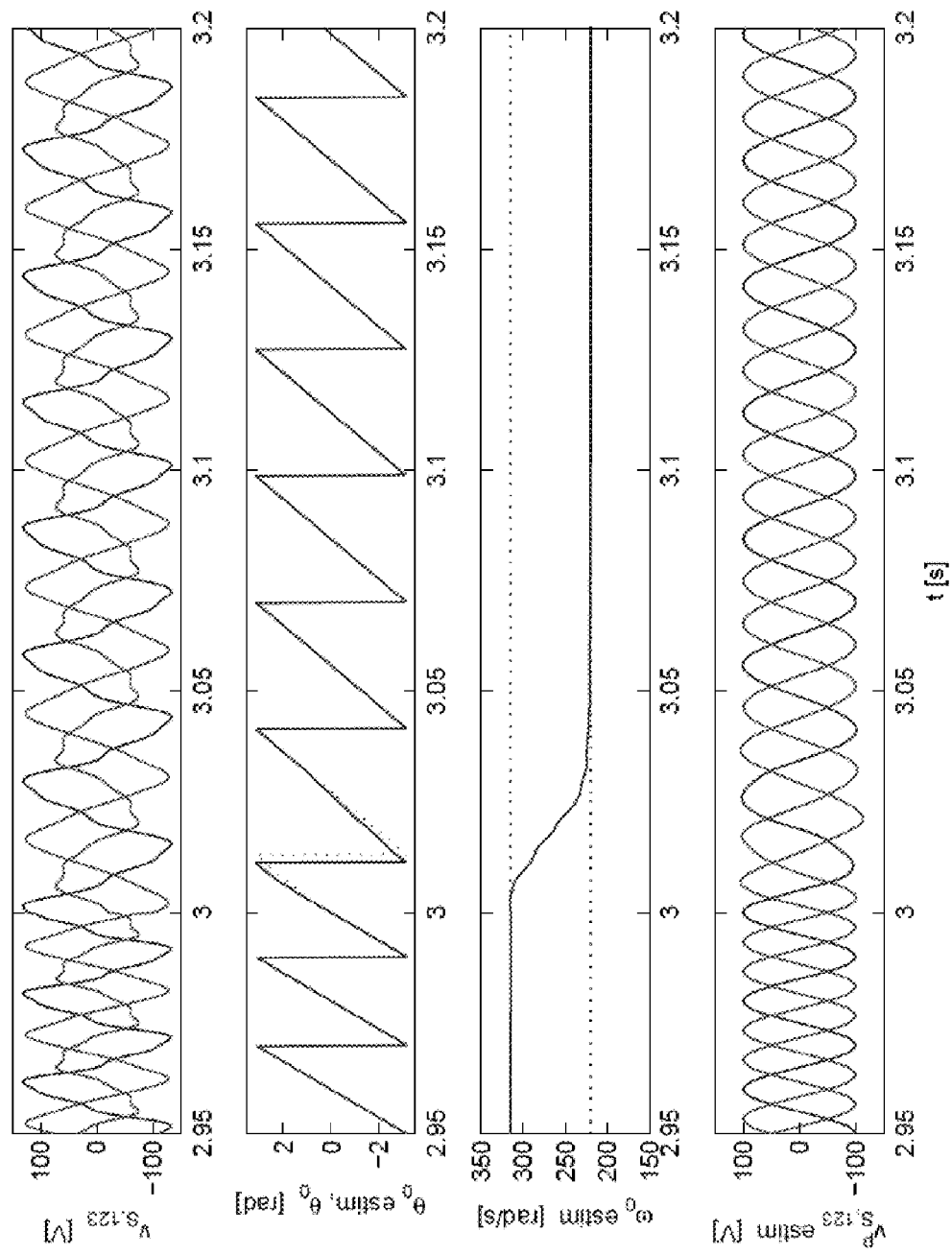

FIG. 6 illustrates another transient response in accordance with an exemplary embodiment. FIG. 6 shows the transient response of the UH-PLL to a step change in the angular frequency of the reference signal going from 314.16 rad/s (50 Hz) to 219.9 rad/s (35 Hz) at t=3 s. After a short transient the estimated phase angle follows the actual phase angle. The estimated fundamental frequency, starting from a reference of 314.16 rad/s (50 Hz), reaches its new reference fixed to 219.9 rad/s (35 Hz) in a relatively short time. The lower plot shows that the estimated positive sequence signals maintain their amplitude after a relatively short transient.

Figure 7:
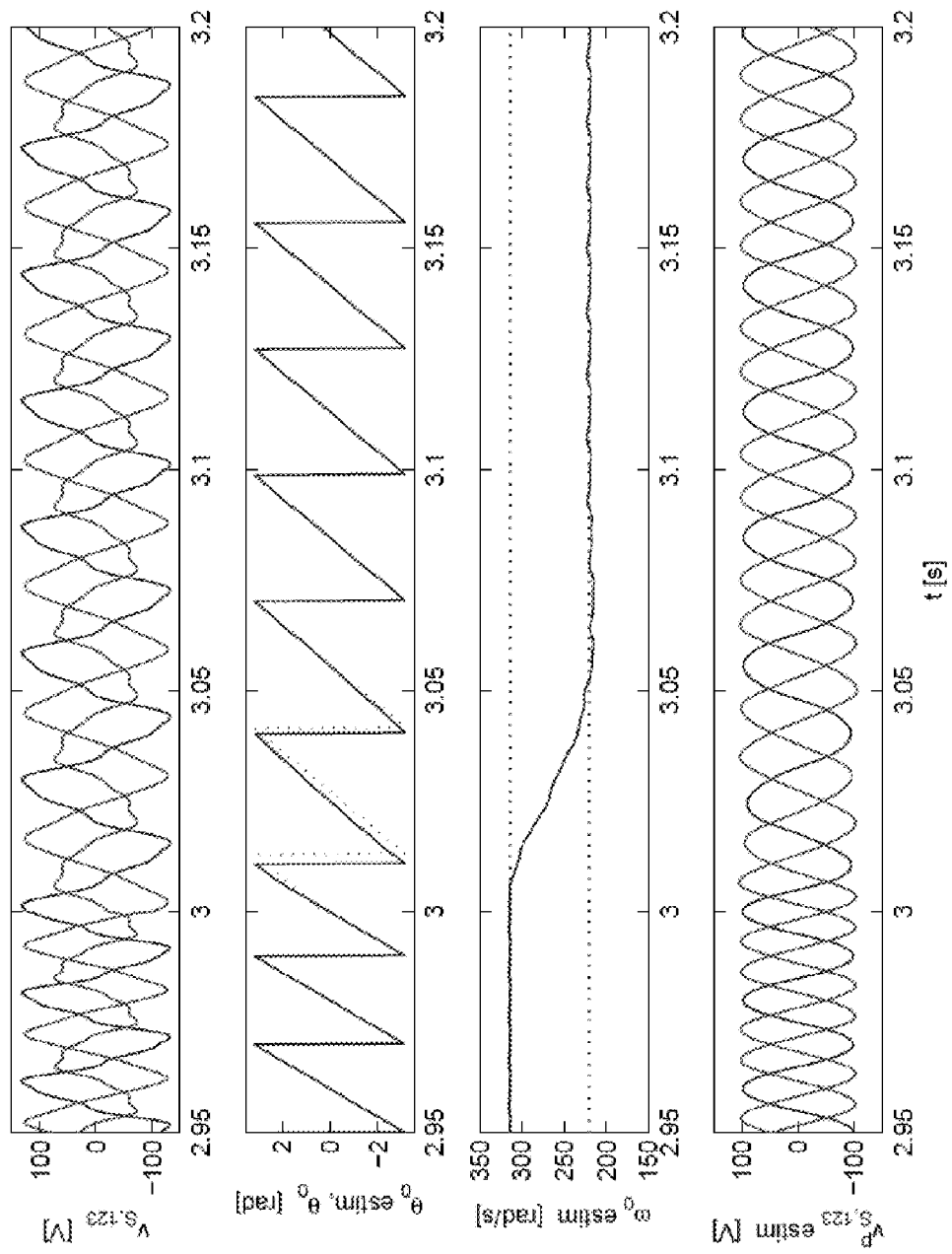

FIG. 7 illustrates a conventional transient response in accordance with the prior art. FIG. 7 shows the transient response of the FRF-PLL of [15] to a step change in the angular frequency of the reference signal going from 314.16 rad/s (50 Hz) to 219.9 rad/s (35 Hz) at t=3 s. In contrast to the response of the UH-PLL, the FRF-PLL response takes slightly more time in addition to the persistent fluctuations. At a lower frequency (35 Hz) the fluctuation in all signals is even more evident.

Thus, it will be appreciated by those skilled in the art that the exemplary embodiments of the present disclosure can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCES

[1] Hsieh and J. C. Hung, "Phase-locked loop techniques—a survey," IEEE Trans. Ind. Electron., Vol. 43(6), pp. 609-615, December 1996.

[2] IEEE PES Working Group, FACTS Applications, IEEE Press, Publ. No. 96-TP-116, 1996.

[3] N. G. Hingorani and L. Gyugyi. Understanding FACTS. IEEE Press, New York, 2000.

[4] M. Cichowlas, M. Malinowski, D. L. Sobczuk, M. P. Kazmierkowski, P. Rodriguez, and J. Pou, "Active, filtering function of three-phase PWM boost rectifier under different line voltage conditions," IEEE Trans. Ind. Electron., Vol. 52, Issue 2, pp. 410419, April 2005.

[5] R. Teodorescu and F. Blaabjerg, "Flexible control of small wind turbines with grid failure detection operating in stand-alone and grid connected mode," IEEE Trans. Power Electron., Vol. 19, Issue 5, pp. 13231332, September 2004.

[6] V. Kaura and V. Blasco, "Operation of a phase locked loop system under distorted utility conditions," IEEE Trans. on Ind. Appl., Vol. 33, Issue 1, pp. 58-63, January/February 1997.

[7] L. N. Arruda, S. M. Silva and B. J. Cardoso, "PLL structures for utility connected systems," Proc. 36th IEEE-IAS Annual Meeting., USA, 30 Sep.-4 Oct. 2001, Vol. 4, pp. 2655-2660.

[8] P. Rodriguez, et al., "Decoupled double synchronous reference frame PLL for Power converters control," IEEE Trans. on Ind. Electron., Vol. 22, Issue 2, pp. 584-592, March 2007.

[9] A. Ghosh, et al., "A new algorithm for the generation of reference voltages of a DVR using the method of instantaneous symmetrical components," IEEE Power Eng. Rev., Vol. 22, Issue 1, pp. 63-65, January 2002.

[10] J. Svensson, "Synchronization methods for grid connected voltage source converters," Proc. Inst. Electr. Eng., Vol. 148, Issue 1, pp. 229-235, May 2001.

[11] H. S. Song, H. G. Park and K. Nam, "An instantaneous phase angle detection algorithm under unbalanced line voltage condition," Proc. 30th IEEE Power Electron. Spec. Conf. PESC 99, 27 June-1 Jul. 1999, Vol. 1, pp. 533-537.

[12] S. M. Silva, B. M. Lopes, B. J. Cardoso, R. P. Campana, and W. C. Boaventura, "Performance evaluation of PLL algorithms for single-phase grid connected systems," in Proc. IEEE Ind. Appl. Annual Meeting IAS 04, Vol. 4, 2004, pp. 2259-2263.

[13] M. Karimi-Ghartemani and M. R. Iravani, "A method for synchronization of power electronic converters in polluted and variable-frequency environments," IEEE Trans. Power Syst., Vol. 19, Issue 3, pp. 1263-1270, August 2004.

[14] H. Song and K. Nam, "Instantaneous phase-angle estimation algorithm under unbalanced voltage-sag conditions," Proc. Inst. Elect. Eng., Vol, 147, pp. 409415, November 2000.

[15] M. F. Martinez-Montejano, G. Escobar and R. E. Torres-Olguin, "Fixed reference frame phase-locked loop (FRF-PLL) for unbalanced line voltage conditions," in Proc. 39th IEEE Power Electronics Specialists Conference PESC '08, 15-19 June, 2008, pp. 4723-4728.

[16] D. Yazdani, M. Mojiri, A. Bakhshai and G. Joos, "A Fast and Accurate Synchronization Technique for Extraction of Symmetrical Components," IEEE Trans. on Power Electron., Vol. 24, Issue 3, pp. 674-684, March 2009.

[17] M. Mojiri and A. R. Bakhshai, "An adaptive notch filter for frequency estimation of a periodic signal," IEEE Trans. on Autom. Control, Vol. 49, Issue 2, pp. 314-318, February 2004.

[18] P. Rodriguez et al, "Advanced grid synchronization system for power converters under unbalance and distorted operation conditions," in Proc. 32nd IEEE Ind. Electron. Conf. IECON 06, November 2006, pp. 5173-5178.

[19] P. Rodriguez, A. Luna, I. Candela, R. Teodorescu and F. Blaabjerg, "Grid synchronization of power converters using multiple second order generalized integrators," in Proc. 34th IEEE Ind. Electron. Conf. IECON 08, 10-13 Nov. 2008, pp. 755-760.

What is claimed:

1. A method for estimating the frequency of a measured three-phase voltage ($v_{\alpha\beta}$) comprising:
   measuring the three-phase voltage; and
   calculating estimates of a fundamental frequency voltage component ($\hat{v}_{\alpha\beta,1}$) and a difference ($\hat{\phi}_{\alpha\beta,1}$) between positive and negative sequence components of a fundamental frequency voltage, from an error ($\tilde{v}_{\alpha\beta}$) between the measured three-phase voltage ($v_{\alpha\beta}$) and at least one of the calculated estimates of the fundamental frequency voltage component ($\hat{v}_{\alpha\beta,1}$) and from an estimate of an angular frequency ($\hat{\omega}_0$) of the fundamental frequency voltage component;
   generating at least a clean electrical signal corresponding to the measured three-phase voltage based on the estimates of the fundamental frequency voltage component ($\hat{v}_{\alpha\beta,1}$)
   wherein the estimate of the angular frequency ($\hat{\omega}_0$) of the fundamental frequency voltage component is calculated from at least one of the estimated differences ($\hat{\phi}_{\alpha\beta,1}$) and from the error ($\tilde{v}_{\alpha\beta}$) between the measured three-phase voltage and at least one of the calculated estimates of the fundamental frequency voltage component.

2. The method according to claim 1, wherein the estimates are calculated by using an estimator, in which the fundamental frequency voltage component ($\hat{v}_{\alpha\beta,1}$) and the difference ($\hat{\phi}_{\alpha\beta,1}$) between positive and negative sequence components of the fundamental frequency voltage are the state variables, and the estimate of the angular frequency is reconstructed using an adaptive law.

3. The method according to claim 1, comprising:
   calculating a positive sequence component ($v_{\alpha\beta,1}^p$) of the fundamental frequency voltage component from the estimated fundamental frequency voltage component ($\hat{v}_{\alpha\beta,1}$) and the difference ($\hat{\phi}_{\alpha\beta,1}$) between positive and negative sequence components of the fundamental frequency voltage,
   wherein the positive sequence component of the fundamental frequency voltage component has a frequency of the measured three-phase voltage ($v_{\alpha\beta}$).

4. The method according to claim 1, comprising:
   calculating a negative sequence component ($v_{\alpha\beta,1}^n$) of the fundamental frequency voltage component from the estimated fundamental frequency voltage component ($\hat{v}_{\alpha\beta,1}$) and the difference ($\hat{\phi}_{\alpha\beta,1}$) between positive and negative sequence components of the fundamental frequency voltage,
   wherein the positive sequence component of the fundamental frequency voltage component has a frequency of the measured three-phase voltage ($v_{\alpha\beta}$).

5. The method according to claim 1, comprising:
   estimating selected harmonic components ($\hat{v}_{\alpha\beta,h}$) of the measured three-phase voltage by using the error ($\tilde{v}_{\alpha\beta}$) between the measured three-phase voltage ($v_{\alpha\beta}$) and the calculated estimate of the fundamental frequency voltage component ($\hat{v}_{\alpha\beta,1}$) and the estimate of the angular frequency ($\hat{\omega}_0$) of the fundamental voltage component; and
   subtracting the estimated selected harmonic components ($\hat{v}_{\alpha\beta,h}$) from the measured three-phase voltage to eliminate the effects of harmonic distortion from the measured signal.

6. An arrangement for estimating the frequency of a measured three-phase voltage ($v_{\alpha\beta}$), comprising:
   means for measuring the three-phase voltage ($v_{\alpha\beta}$); and
   means for calculating estimates of a fundamental frequency voltage component ($\hat{v}_{\alpha\beta,1}$) and a difference ($\hat{\phi}_{\alpha\beta,1}$) between positive and negative sequence components of a fundamental frequency voltage from an error ($\tilde{v}_{\alpha\beta}$) between the measured three-phase voltage ($v_{\alpha\beta}$) and at least one of the calculated estimates of the fundamental frequency voltage component ($\hat{v}_{\alpha\beta,1}$) and from an estimate of an angular frequency ($\hat{\omega}_0$) of the fundamental voltage component, wherein the estimate of the angular frequency ($\hat{\omega}_0$) of the fundamental frequency voltage component is calculated from at least one of the estimated differences ($\hat{\phi}_{\alpha\beta,1}$) and from the error ($\tilde{v}_{\alpha\beta}$) between the measured three-phase voltage and at least one of the calculated estimates of the fundamental frequency voltage component.

\* \* \* \* \*